US006773860B2

(12) United States Patent
Kuroki et al.

(10) Patent No.: US 6,773,860 B2
(45) Date of Patent: Aug. 10, 2004

(54) TRANSFERABLE IMAGE RECEIVING SHEET AND IMAGING PROCESS BY USE THEREOF

(75) Inventors: Takaaki Kuroki, Tokyo (JP); Rieko Takahashi, Tokyo (JP)

(73) Assignee: Konica Corporation, Tokyo (JP)

( * ) Notice: Subject to any disclaimer, the term of this patent is extended or adjusted under 35 U.S.C. 154(b) by 145 days.

(21) Appl. No.: 10/225,858

(22) Filed: Aug. 22, 2002

(65) Prior Publication Data

US 2003/0138607 A1 Jul. 24, 2003

(30) Foreign Application Priority Data

Aug. 30, 2001 (JP) ....................................... 2001-261380

(51) Int. Cl.[7] ............................. G03F 7/11; G03F 7/34; G03F 7/40; G03C 11/12

(52) U.S. Cl. ....................... 430/200; 430/207; 430/256; 430/259; 430/262

(58) Field of Search ................................ 430/200, 256, 430/207, 259, 262

(56) References Cited

U.S. PATENT DOCUMENTS 5,633,116 A * 5/1997 Kapusniak et al. ......... 430/200
6,027,850 A * 2/2000 Kawakami et al. ......... 430/200
6,326,121 B1 * 12/2001 Takahashi .................. 430/200
6,436,603 B1 * 8/2002 Kuroki et al. ............. 430/200
6,475,695 B2 * 11/2002 Kuroki et al. ............. 430/200

* cited by examiner

*Primary Examiner*—Richard L. Schilling
(74) *Attorney, Agent, or Firm*—Frishauf, Holtz, Goodman & Chick, P.C.

(57) ABSTRACT

An image receiving sheet, in which the received image is further transferable to a final recording medium is disclosed, comprising a support having thereon a heat-softening layer, an interlayer and an image receiving layer, wherein the interlayer has a surface roughness ($R_a$) of 0.05 to 5 $\mu$m and the image receiving layer has a surface roughness ($R_a$) of 0.01 to 0.4 $\mu$m, and the surface roughness ($R_a$) of the interlayer being greater than that of the image receiving layer. An imaging process by use of the image receiving sheet is also disclosed.

15 Claims, No Drawings

TRANSFERABLE IMAGE RECEIVING SHEET AND IMAGING PROCESS BY USE THEREOF

FIELD OF THE INVENTION

The present invention relates to an image receiving sheet, which is further transferable and an imaging method by the use thereof, and in particular to a transferable image receiving sheet suitable for thermally melted transfer for use in laser recording and an imaging method by the use thereof. Specifically, the invention relates to an image receiving sheet, which further transfers the received image and which exhibits superiority in sensitivity, in solid area density quality, in fine-line reproduction and in storage stability as a print proof employing printing paper or film substrate as a final recording medium and in addition has image glossiness approximating the surface of the final recording medium.

BACKGROUND OF THE INVENTION

Along with the spread of imaging technologies from digital data, specifically in the field of graphic arts, there is increased the need for digital color proofs (hereinafter, also denoted as DDCP). In such DDCP, color reproduction and reproducible stability of printed matter are required, and a laser thermal transfer technology is applied thereto. Exemplarily, there is disclosed a technique, in which using an ink sheet for use in laser thermal transfer which comprises a light-to-heat conversion layer and a coloring material layer, and an image receiving sheet for use in laser thermal transfer which comprises an image receiving layer accepting an ink layer of the ink sheet and a thermally softening layer (heat-softening layer), the ink layer side of the ink sheet is allowed to face the image receiving layer side of the image receiving sheet, imagewise laser exposure is conducted from the ink sheet side, and the ink layer is thermally transferred onto the image receiving layer side through light-to-heat conversion, followed by thermal transfer from the image receiving sheet carrying the image onto the final recording medium.

Such a type of DDCP, in which a final image can be outputted on the same kind of paper as used in printing is preferable as a final proof sample in terms of half tone dot output and use of printing colorant and printing paper. Various kinds of paper are used in printing, and art paper, coated paper, matte paper, slightly coated paper and non-coated paper are cited according to the kind thereof.

Recently, desire has increased to use a broader range of paper for the foregoing DDCP. In response to such desire, a technique for improving the physical property of the heat-softening layer, thereby improving transferability onto paper, ranging from matte paper to fine-quality paper, has been disclosed in JP-A 2001-138648. It is a point that the user-desired level of proofs corresponding to the printing paper is not only being transferred onto paper but also the paper being similar to printing matter with respect to non-imaging/imaging areas.

Techniques regarding the following items 1) through 3) were disclosed as a prior art for glossiness adjustment by the inventors of this application:

1) A so-called ink-on recording system in which after forming an ink image on an intermediate medium, the ink image is further transferred to the final recording medium;
2) A method in which thermal deformability of the intermediate transfer medium is raised, thereby enhancing ability of following paper at the time of retransfer and closely resembling non-imaging areas of the paper; and
3) a method and material, in which in a system of transferring the whole image receiving layer having an ink image is transferred, the image receiving layer surface is roughened to approximating the non-imaging area of the final recording medium.

However, in ink-on recording system of 1), problems arose that imaging areas were roughened at the time of retransfer and peeling, lowering glossiness in the imaging areas, and quality was unsuitable when high glossy paper such as art paper was used. With regard to the method of 2), there were two problems to be solved. Thus, the first problem was that when transferred to and peeled from the final recording medium, the peeling face followed unevenness of the paper surface and peeling was so severe that enhancing thermal deformability without providing a peelable interlayer scarcely causing thermal deformation damaged the final recording medium with high probability. The second problem is that in the case of smooth surfaced paper such as art paper, glossiness is not lowered to the level of the paper surface even after applying high heat or pressure and is still unsuitable. Concerning the method 3), the surface-roughened image receiving layer is wholly transferred, producing no roughened imaging area, as is caused in the system 1), and even for smooth art paper, glossiness of non-imaging areas, which is superior to the method 2) can be adjusted to a level equivalent to the intended final recording medium. Accordingly, the method 3) is preferable in terms of adjusting glossiness.

For such an intermediate transfer medium, various performance items other than glossiness are required. For example, the writing speed is an important factor and there is much desire for enhanced sensitivity. From that point of view, it cannot be denied that the surface-roughened intermediate transfer medium such as in the foregoing 3) is disadvantageous.

Furthermore, as an approach for the writing speed from the system, a system in which plural lasers are arrayed to accelerate writing is broadly practiced. However, solid images recorded by such a system are subject to influence of the laser light intensity distribution and the head period, often deteriorating the uniformity of solid image quality. The method 3) was disadvantageous for such a phenomenon. Thus, this produced problems that the travel to transfer the ink layer was relatively long, so that non-uniformity of laser array units easily occurred due to the delicate difference caused by interrupted supply of the ink or heating conditions, for example.

SUMMARY OF THE INVENTION

In view of the foregoing, the present invention was achieved. Thus, it is an object of the invention to provide an transferable image receiving sheet for use in laser thermal transfer, which exhibits superior glossiness even when transferred onto art paper, favorable transferability even onto the final recording medium having an uneven surface, enhanced sensitivity, improved solid image quality and fine-line reproduction; and an imaging method by the use thereof.

It is another object of the invention to disclose a noble imaging method in which the control adhesion balance between layers and cohesive forces of respective layers causes cohesive failure (or cohesion breakdown) of the image receiving layer or interlayer, thereby providing an imaging method exhibiting superior glossiness even when transferred onto art paper, favorable transferability even onto the final recording medium having an uneven surface, enhanced sensitivity, improved solid image quality and fine-line reproduction.

The foregoing object of the invention can be accomplished by the following constitution:

1. A transferable image receiving sheet comprising a support having thereon a heat-softening layer, an interlayer and an image receiving layer in this order from the support, wherein the interlayer has a surface roughness ($R_a$) of 0.05 to 5 $\mu$m and the image receiving layer has a surface roughness ($R_a$) of 0.01 to 0.4 $\mu$m, and the surface roughness ($R_a$) of the interlayer being greater than that of the image receiving layer.

2. An imaging process by use of an image receiving sheet comprising a support having thereon a heat-softening layer, an interlayer and an image receiving layer, the process comprising the steps of:

(a) imagewise exposing an ink sheet to form an image, (b) transferring the image from the ink sheet onto an image receiving sheet, and (c) retransferring the image, together with the image receiving layer, onto a final recording medium, wherein the interlayer has a surface roughness ($R_a$) of 0.05 to 5.0 $\mu$m and the image receiving layer has a surface roughness ($R_a$) of 0.01 to 0.4 $\mu$m, and the surface roughness ($R_a$) of the interlayer being greater than that of the image receiving layer.

3. An imaging process using an image receiving sheet comprising a support having thereon a heat-softening layer and an image receiving layer, the process comprising:

forming an image on the image receiving sheet from an ink sheet, and transferring the formed image and an image receiving layer to a final recording medium, wherein the following requirement is satisfied:

$$F_1, F_2, F_3, F_4, F_5, F_7 > F_6$$

wherein $F_1$ is an adhesive strength between the image receiving layer and a lower layer, $F_2$ is an adhesive strength between the image receiving layer and the image, $F_3$ is a adhesive strength between the image receiving layer and the final recording medium, $F_4$ is an adhesive strength between the image and the final recording medium, $F_5$ is a cohesive force of the lower layer, $F_6$ is a cohesive force of the image receiving layer and $F_7$ is a cohesive force of the image;

4. An imaging process using an image receiving sheet comprising a support having thereon a heat-softening layer, an interlayer and an image receiving layer, the process comprising:

forming an image on the image receiving sheet from an ink sheet, and transferring the formed image and an image receiving layer to a final recording medium, wherein the following requirement is satisfied:

$$F_{11}, F_{12}, F_{13}, F_{14}, F_{15}, F_{16}, F_{18}, F_{19} > F_{17}$$

wherein $F_{11}$ is an adhesive strength between the image receiving layer and a lower layer, $F_{12}$ is an adhesive strength between the image receiving layer and the image, $F_{13}$ is an adhesive strength between the image receiving layer and the final recording medium, $F_{13}$ is an adhesive strength between the image and the final recording medium, $F_{15}$ is an adhesive strength between the interlayer and the heat-softening layer, $F_{16}$ is a cohesive strength of the heat-softening layer, $F_{17}$ is a cohesive strength of the interlayer, $F_{18}$ is a cohesive strength of the image receiving layer and $F_{19}$ is a cohesive strength of the image.

DETAILED DESCRIPTION OF THE INVENTION

In the transferable image receiving sheet according to the invention (which is, hereinafter, also denoted simply as an image receiving sheet), a heat-softening layer, an interlayer, and an image receiving layer are layered in this order on a support.

As a support for use in the image receiving sheet of the invention, commonly known supports are usable, without specific limitation. Examples thereof include various types of paper materials comprised of monolayer or multi-layers, such as paper, coated paper, synthetic paper (polypropylene, polystyrene or composite material thereof, which is laminated with paper); plastic resin films or sheets, such as vinyl chloride resin sheet, ABS resin sheet, poly(ethylene terephthalate) film, poly(butylene terephthalate) film, poly (ethylene naphthalate) film, polyacrylate film, polycarbonate film, poly(ether ketone) film, polysulfone film, poly(ether sulfone) film, poly(ether imide) film, polyimide film, polyethylene film, polypropylene film, polystyrene film, stretched nylon film and polyacetate film, films or sheets formed of various metals; films or sheets formed of various kinds of ceramics; metal plates such as aluminum, stainless steel, chromium and nickel; and resin-coated paper laminated or evaporated with a metal thin layer.

The thickness of the support is preferably 30 to 200 $\mu$m, and more preferably 50 to 125 $\mu$m. The support may be subjected to various treatments to enhance dimensional stability or antistatic property. Examples of an antistatic agent include cationic surfactants, anionic surfactants, nonionic surfactants, polymer antistatic agents, fine conductive particles, and compounds described in "11290 Chemical Goods" on page 875 to 876, published by KAGAKU-KOGYO NIPPO-SHA. Furthermore, commonly known surface modification techniques are also applicable.

Next, the heat-softening layer relating to the invention will now be described. The image receiving sheet is necessary to follow any surface roughness of final recording mediums, so that the heat-softening layer requires high fluidity under heat or pressure. To satisfy such a characteristic, the heat-softening layer is to be a layer exhibiting heat-softening property or elasticity (hereinafter, also called a cushioning property). There are employed materials capable of being softened and deformed upon heating, materials having a relatively low elasticity and materials having a rubber elasticity. In the invention, elasticity or penetration degree are employed as a measure of the cushioning property. For example, a layer exhibiting an elasticity of $9.8\times10^6$ to $24.5\times10^7$ Pa or a layer exhibiting a penetration degree (as defined in JIS K 2530-1976) of 15 to 500 (g) and preferably 30 to 300 (g) was confirmed to exhibit a suitable cushioning property in the formation of color proof images used in graphic arts. The required level is variable, depending on the use thereof and may be selected for optimal performance.

Material used in the heat-softening layer preferably exhibits no fluidity and elasticity at ordinary temperatures and exhibits marked fluidity at higher temperatures exceeding the softening temperature thereof.

The heat-softening layer preferably exhibits a TMA softening point of not less than 40° C., and more preferably 40 to 80° C. The TMA softening point can be determined through thermo-mechanical analysis (or denoted as TMA).

Thus, a measurement subject is heated at a constant temperature-increasing rate, while applying a given load and the phase of the measurement subject is observed. In the invention, a temperature at which the phase of the measurement subject starts to vary is defined as the TMA softening point. Measurement of the softening point through the TMA can be carried out using a commercially available apparatus, such as Thermoflex (available from RIGAKU DENKI Co., Ltd.). For example, using the Thermoflex, a measurement sample is heated at a temperature-increasing rate of 5° C./min within the range of 25 to 200° C., while applying a load of 10 g to a quartz glass pin (needle) and the temperature at which the phase starts to vary is defined as the TMA softening point.

Preferable characteristics of the heat-softening layer are not necessarily depend on the kind of material, but examples of preferred material include polyolefin resin, ethylene-vinyl acetate copolymer, ethylene-ethyl acrylate copolymer, polybutadiene resin, styrene-butadiene copolymer (SBR), styrene-ethylene-butene-styrene copolymer (SEBS), acrylonitrile-butadiene copolymer (NBR), polyisoprene resin (IR), styrene-isoprene copolymer (SIS), acrylic acid ester copolymer, polyester resin, polyurethane resin, acryl resin, butyl rubber and polynorbornene. Of these, materials having a relative low molecular weight easily satisfy the requirement of the invention but they are not necessarily limited in relation to material. The heat-softening layer can be provided by the solvent coating. Alternatively, the heat-softening layer can also be provided by coating an aqueous dispersion, such as a latex or aqueous emulsion. There can also be used water-soluble resins. Such resins may be used alone or in combination thereof.

In addition to the foregoing material, various additives may be incorporated into the heat-softening layer to provide preferable characteristics. Examples of such additives include a low-melting material such as wax, a plasticizer, a thermal solvent and a tackifier. Waxes include, for example, vegetable waxes such as carnauba wax, Japan wax, auricurie wax, espar wax; animal waxws such as bees wax, insect wax, shellac wax and whale wax; petroleum waxes such as paraffin wax, microcrystal waxpolyethylene wax, ester wax and acid wax; and mineral waxes such as montan wax, ozocerite wax and ceresin. Further to the foregoing waxes are also cited higher fatty acids such as palmitic acid, stearic acid, margaric acid, and behenic acid; higher alcohols such as palmityl alcohol, stearyl alcohol, behenyl alcohol, marganyl alcohol, myricyl alcohol and eicosanol; higher fatty acid esters such as cetyl palmitate, myricyl palmitate, cetyl stearate, and myricyl stearate; amides such as acetoamide, propionic acid amide, palmitic acid amide, stearic acid amide, and amide wax; and higher amines such as stearylamine, behenylamine, and palmitylamine. Of these, ambient-temperature solids (i.e., material which is solid at ordinary temperature) are preferred and those which exhibit a melting point of 40 to 130° C., and more preferably 70 to 110° C. are preferred. Examples of the plasticizer, thermal solvent and tackifier include phthalic acid esters, phosphoric acid esters, and chlorinated paraffins. Furthermore, various additives described in, for example, "Plastic-oyobi Rubber-yo Tenkazai Jitsuyo-Handbook" (Practical Handbook of Additives for Plastic Resin and Rubber), published by KAGAKUKOGYO-SHA (1970).

The foregoing additives are incorporated in an amount necessary to display preferable physical properties, in combination with the base material of the heat-softening layer, being usually not more than 10% by weight, and preferably not more than 5% by weight, based on the heat-softening layer.

To form the heat-softening layer, the foregoing material is dissolved in a solvent or dispersed in the form of a latex and coated by means of a blade coater, roll coater, bar coater, curtain coater or gravure coater. Alternatively, hot melt extrusion and lamination methods are also applicable. A resin layer having a void structure, in which heat-softening or thermoplastic resin is caused to be foamed is also feasible as a specific heat-softening layer.

The thickness of the heat-softening layer is preferably not less than 5 μm, and more preferably not less than 10 μm. A heat-softening layer thickness of less than 5 μm often produces loopholes or cracks at the time of retransfer to the final recording medium.

One aspect of invention is that the image receiving sheet comprises on the support a heat-softening layer, an interlayer and an image receiving layer and of these layers, and the interlayer surface being more rough than the image receiving layer surface, i.e., the interlayer has a surface roughness greater than that of the image receiving layer. In one preferred embodiment of the invention, the surface of the interlayer is the most roughened. In this regard, the heat-softening layer surface is preferably smooth. In this aspect, the surface of the heat-softening layer is not specifically limited and is optimally provided in relation to the interlayer.

The heat-softening layer surface preferably exhibits a friction factor of 0.1 to 3.0, and more preferably 0.15 to 2.0, and a surface roughness (Ra) of 0.01 to 5 μm, more preferably 0.03 to 3 μm, and still more preferably 0.05 to 1 μm.

Next, the interlayer will be detailed. The interlayer relating to the invention contributes to adjustability of glossiness. Methods to lowering glossiness include the following four:

(1) inclusion of a matting agent in a binder
(2) the use of a blend of incompatible resins as a binder
(3) forming a smooth resin layer and physically embossing the surface thereof and
(4) making the cohesive strength of the interlayer lower than the cohesive strength/interlayer adhesive strength of other layers, thereby causing cohesive failure of the interlayer.

The foregoing will be further described.

In the embodiments of (1), exemplary examples of the binder include polyolefin, silicone resin, polyester, polyvinyl acetal, polyvinyl formal, polyparabenic acid, poly (methyl methacrylate), polycarbonate, ethyl cellulose, nitrocellulose, methyl cellulose, carboxymethyl cellulose, hydroxypropyl cellulose, polyvinyl chloride, urethane resin, fluororesin, styrenes such as polystyrene and acrylonitrile styrene, and their hardened resins, and thermosetting resins such as polyamide, polyimide, polyether imide, polysulfone, polyether sulfone and hardened resins thereof, in which commonly known hardening agentos are used, such as isocyanates and melamines. Of these, resins exhibiting Tg (glass transition temperature) of 65° C. or higher and their hardened ones are preferable. Specifically, polycarbonate, acetal, ethyl cellulose, methyl cellulose and hydroxymethyl cellulose are preferable. Preferred resins require a tensile strength of 1 to 1000 MPa, and more preferably 2 to 500 MPa. A tensile strength of less than 1 MPa makes it difficult to follow softening of the heat-softening layer, rendering it difficult to use it in manufacture. A tensile strength of more than 1000 MPa inhibits transfer to the final recording medium. The elongation percentage of the resin is preferably 0.1 to 100%. Elongation of less than 0.1% makes it difficult to follow softening of the heat-softening layer and in the case of elongation of more than 100%, peeling becomes more difficult when transferred to roughened paper.

However, characteristics of a preferred resin are to be finally those of the interlayer, which can be achieved by mixing various additives.

As a matting agent to be added to a binder are used fine, organic or inorganic particles. Examples of organic matting agents include fine particles of polymethyl methacrylate (PMMA), polystyrene, polyethylene, polypropylene or other radical polymerization type polymers, fine particles of condensation polymers such as polyester and polycarbonate, and fine particles of fluororesin or silicone resin. Cured fine organic particles are further preferable to enhance particle strength and solvent resistance.

The coating amount of the interlayer is preferably 0.1 to 10.0 g/$m^2$, more preferably 0.1 to 5.0 g/$m^2$, and still more preferably 0.2 to 5.0 g/$m^2$. The interlayer thickness id preferably 0.1 to 5.0 $\mu$m. The coating amount of the matting agent is preferably 0.3 to 10.0 g/$m^2$, and more preferably 0.3 to 5.0 g/$m^2$.

Matting agents used in the invention preferably have an average particle size (average primary particle size) of 0.3 to 5.0 $\mu$m. The average primary particle size can be determined by commonly known dynamic light scattering method or laser diffraction method. Specifically, particles of 0.3 $\mu$m or more are contained preferably in an amount of not less than 0.005 g/$m^2$, and more preferably 0.006 to 5 g/$m^2$. The matting agent preferably has a coefficient of variance ($\sigma$) of particle size distribution of not more than 0.5, more preferably not more than 0.3, and still more preferably not more than 0.15. The matting agent is added preferably in an amount of 0.1 to 50%, and more preferably 0.5 to 40% by weight. An absolute specific gravity of the particles is not specifically limited, but is preferably 0.1 to 1.5, more preferably 0.3 to 1.4, and still more preferably 0.5 to 1.3.

The interlayer preferably exhibits a surface roughness ($R_a$) of 0.05 to 5 $\mu$m, more preferably 0.05 to 3.5 $\mu$m, and still more preferably 0.08 to 2 $\mu$m, in which the surface roughness ($R_a$) refers to center-line mean roughness. A surface roughness ($R_z$) of the interlayer is preferably 0.3 to 10 $\mu$m, more preferably 0.5 to 9 $\mu$m, and still more preferably 0.8 to 8 $\mu$m, in which the surface roughness ($R_z$) refers to ten-point mean roughness. The center-line mean roughness ($R_a$) and ten-point mean roughness ($R_z$) each are defined in JIS B 0601 (Definitions and Designation of Surface Roughness), which corresponds to ISO 468-1982, ISO 4287/1-1984 and ISO 4287/2-1987. The parameters $R_a$ and $R_z$ each indicate surface smoothness, which is commonly employed in the art.

The center-line mean roughness ($R_a$), which is also called an arithmetic mean roughness, is a parameter representing an averaged value of surface roughness caused by protrusions (or peaks and valleys) on the surface. The higher this value, the larger the average roughness. The ten-point mean roughness ($R_z$) is a parameter representing a local roughness at the position exhibiting specifically larger protrusions.

Alternatively, the center-line mean roughness ($R_a$), when the roughness curve has been expressed by y=f(x), is a value, expressed in micrometer ($\mu$m), that is obtained from the following formula , extracting a part of reference length L in the direction of its center-line from the roughness curve, and taking the center-line of this extracted part as X-axis and the direction vertical magnification as Y-axis:

$$Ra = \frac{1}{L}\int_0^L |f(x)|\,dx$$

The ten-point mean roughness ($R_z$) is the value of difference, expressed in micrometer ($\mu$m), between the mean value of altitudes of peaks from the highest to the 5th, measured in the direction of vertical magnification from a straight line that is parallel to the mean line and that does not intersect the profile, and the mean value of altitudes of valleys from the deepest to the 5th, within a samples portion, of which length corresponds to the reference length, from the profile.

The interlayer may optionally be added with a peeling agent, conductivity-increasing agent, surfactant, antioxidant or UV absorber. Specifically, the peeling agent is essential. The peeling strength of the interlayer increases incrementally based on peeling surface area, due to addition of the matting agent. Thus, it is preferred to add commonly known peeling agents to the interlayer to optimize the peeling strength. The peeling agent, which is less mobile to the image receiving layer is preferred, thereby inhibiting variation of ink-transferability, due to the movement thereof. The peeling strength of the interlayer refers to the peeling strength between the interlayer and the final recording medium at the time when an image and the image receiving layer provided on the interlayer are peeled off from the interlayer and transferred onto a final recording medium in accordance with the imaging process to be described later, i.e., peeling resistance of the interlayer. The peeling strength of the interlayer is preferably $9.8\times10^{-3}$ to 1.96 N/cm, more preferably $9.8\times10^{-3}$ to 0.98 N/cm, and still more preferably $9.8\times10^{-3}$ to 0.49 N/cm. Even in various kinds pf final recording mediums, the peeling strength thereof is preferably similar to the above values.

In the embodiments of the foregoing (2), at least two kinds of resins, which are incompatible with each other, i.e., incompatible resins are blended in a ratio within a range of 30:70 to 50:50 (by weight). The incompatible resins refers to resins having a difference in SP value of at least 1, and preferably at least 2. It is also preferred to blend resins having a difference in SP value of at least 1, and more preferably at least 2. Herein, the SP value is referred to as a solubility parameter, as is well known in the art. The combination of a solution and a polymer emulsion using a solvent similar to the solution is also useful to achieve incompatibility.

In the embodiments of the foregoing (3), the resin used therein is preferably one exhibiting thermoplasticity of the polymers described earlier. The resin preferably exhibits a TMA softening point (which was described earlier) of not less than 100° C., more preferably not less than 120° C. and still more preferably 140 to 200° C. A TMA softening point of less than 100° C. is not preferred in terms of storage stability and one exceeding 200° C. renders embossing difficult. A heat or pressure treatment is useful for embossing and it is suitable to alter surface characteristics by means of heat an/or pressure roller.

In the embodiments of (4), in the process of retransfer to the final recording medium, the interlayer itself causes cohesive failure to be released, and known techniques for achieving this are applicable thereto. Examples thereof include a method in which super-cooling material is included in the interlayer and the interlayer is peel off immediately after being heated, a method in which a blend of incompatible resins are incorporated as a binder of the interlayer, thereby lowering cohesion of the layer, as described earlier (2), a method in which a low melting compound such as wax is incorporated into the binder resin, thereby lowering cohesion of the layer, or causing the wax to be bled out to provide a cohesive failure-peeling layer (i.e. layer capable of being peeled upon cohesive failure), and a method in which a resin capable of initiating depolymerization upon exposure and after exposure, peeling causes cohesive failure.

Examples of the super-cooling material include poly-ϵ-caprolactam, polyoxyethylene, benzotriazole, tribenzylamine and vanillin. In another embodiment of the invention, the interlayer contains a compound capable of lowering adhesion with the image receiving layer. Examples of such a compound include a silicone resin such as silicone oil, polyoxysiloxane resin, Teflon (R), fluorinated acryl resin, polysiloxane resin, acetal type resin such as poluvinyl butyral, polyvinyl acetal, and polyvinyl formal, solid waxes suchas polyethylene wax and amide wax, and fluorinated or phosphoric acid ester type surfactants.

Sufficient adhesion of the interlayer with the lower layer (e.g., heat-softening layer) or with the image receiving layer is needed to cause cohesive failure so that it is essential to select a resin having high affinity with the lower layer or image receiving layer.

Formation of the interlayer is conducted in such a manner that the foregoing materials are dissolved in a solvent or dispersed in the form of a latex, and coating by a blade coater, roll coater, curtain coater or gravure coater, or a hot melt extrusion lamination method is applied thereto. Alternatively, the foregoing materials, which are dissolved in a solvent or dispersed in the form of a latex are coated on a temporary base and laminated with a heat-softening layer, followed by being peeled apart to form an interlayer.

Next, the image receiving layer will be described. The image receiving layer is comprised of a binder and optional additives. The image receiving layer according to the invention is a layer contributing to exposure characteristics and storage stability of glossiness.

Binders used in the image receiving layer preferably exhibit a TMA-softening point (a softening point obtained by the thermomechanical analysis) of not les than 40° C., more preferably 40 to 80° C., and still more preferably 40 to 70° C. Exemplary examples of the binder used in the image receiving layer include adhesives such as polyvinyl acetate emulsion type adhesives, chloroprene type adhesives and epoxy resin type adhesives; adhesives such as natural rubber, chloroprene rubber type-, butyl rubber type-, polyacrylic acid ester type-, nirile rubber type-, polysulfide type-silicone rubber type- and petroleum type-resin; regenerated rubber, vinyl chloride type resin, SBR, polybutadiene resin, polyisoprene, polyvinyl butyral resin, polyvinyl ether, ionomer resin, SIS, SEBS, acryl resin, ethylene copolymer, ethylene-vinyl chloride copolymer, ethylene-acrylic acid copolymer, ethylene-vinyl acetate resin (EVA), vinyl chloride graft EVA resin, EVA graft vinyl chloride resin, vinyl chloride type resin, urethane resin, polyester resin, polyolefin resin, various modified olefins, and polyvinyl butyral. Of these, preferred binders used in the invention include polyolefin such as polyethylene, or polypropylene; ethylene copolymer such as ethylene-vinyl acetate copolymer, ethylene-acrylic acid copolymer, polyvinyl chloride; vinyl chloride copolymer such as vinyl chloride-vinyl acetate copolymer; polyvinylidene chloride; vinylidene chloride copolymer; polystyrene; styrene copolymer such as styrene-acrylic acid copolymer, styrene-maleic acid ester copolymer; and vinyl acetate copolymer. The foregoing binders may used alone or in combination thereof.

The image receiving layer preferably contains a matting agent. As material of matting agents are usable those which are used in the interlayer, as described earlier. The number-averaged particle size of the matting agent is preferably larger by 0.3 to 10.0 μm, more preferably 0.3 to 8.0 μm, and still more preferably 1 to 5.5 μm than a thickness of an image receiving layer containing no matting agent. A particle size of less than 0.3 μm is less effective in fogging and gas removal, and that of more than 10.0 μm deteriorates sensitivity. In the particle size distribution of the matting agent, particles having at least two times the number-averaged particle size preferably account for not more than 20% by weight, and more preferably not more than 5% by weight of the total particles. In the particle size distribution, in which particles having at least two times the number-averaged particle size preferably account for not more than 20% by weight, pressure is uniformly relaxed, preventing deterioration in storage stability, such as blocking. The distribution of particles having at least two times the number-averaged particle size preferably accounting for not more than 5% by weight is further preferable in terms of storage stability. When using such a matting agent, a binder layer thickness of the interlayer being more than 3.0 μm results in yellowish images due to excessive matting agent. Accordingly, the binder layer thickness of the interlayer is preferably 0.8 to 3.0 μm.

Distribution of the matting agent particles on the image receiving layer surface is also important. The number of matting agent particles in the interlayer is preferably 100 to 2400 particles/$mm^2$. Matting agent particles having a true spherical form further enhances performance due to matting agent addition. The true spherical form means that when observed by an electron microscope, the matting agent particles are of a substantially spherical form and the difference between the major and minor axes is not more than 20%.

The surface roughness $R_a$ (center-line mean roughness) of the image receiving layer is preferably 0.01 to 0.4 μm, more preferably 0.01 to 0.2 μm, and still more preferably 0.01 to 0.15 μm. The surface roughness $R_z$ (ten-point mean roughness) is preferably 0.03 to 5 μm, more preferably 0.05 to 3.5 μm, and still more preferably 0.1 to 2.0 μm. The thickness of the image receiving layer is preferably 0.1 to 5 μm, and more preferably 0.5 to 4 μm. The elongation percentage of a resin used in the image receiving layer is preferably 1 to 1000%, and more preferably 10 to 800%. An elongation percentage of less than 1% often produces unsuitable pinholes, while an elongation of more than 1000% causes a peeling strength to increase, rendering peeling of a large format difficult. The image receiving layer may be optionally added with commonly known additives such as an antioxidant, UV absorber, surfactant, and antistatic agent.

To achieve a cohesive failure-type image receiving layer may be employed a means similar to the foregoing embodiment (4), in which cohesion of the interlayer is lowered. The image receiving layer needs ink-acceptability so that the content of additives is preferably 1 to 50%, more preferably 2 to 40%, and still more preferably 3 to 30% by weight. To achieve cohesive failure, adhesion of the image receiving layer with the lower layer (interlayer) or with ink needs to be sufficient and it is important to select a lower layer and resin miscible with ink. The thickness of the cohesive failure-type image receiving layer is preferably 0.8 to 10 μm, 1.2 to 8 μm, and still more preferably 1.6 to 6 μm.

In one preferred embodiment of the invention, a back coating layer is provided on the on the backside of the support (i.e., opposite side of the image receiving layer side) to provide transportability, heat resistance and antistatic property. Providing the back coating layer is effective in image defect and image quality stability.

The back coating layer can be formed by coating on the backside of the support a coating solution in which a binder resin is dissolved in a solvent or the binder resin and a matting agent having particle sizes of 2 to 30 μm are dissolved or dispersed in a solvent. Examples of a binder used in the back coat layer include commonly used polymers such as gelatin, polyvinyl alcohol, methyl cellulose, nitrocellulose, acetyl cellulose, aromatic polyamide, silicone resin, epoxy resin, alkyd resin, phenol resin, melamine resin fluororesin, polyimide resin, urethane resin, acryl resin, urethane-modified silicone resin, polyethylene resin, polypropylene resin, polyester resin, Teflon (R) resin, polyvinyl butyral, vinyl chloride type resin, polyvinyl acetate, polycarbonate, organic boron compound, aromatic esters, fluorinated polyurethane, and poly(ether sulfone). The use of a curable, water-soluble binder as a binder for the back coat layer is effective in preventing powdery dropping of the matting agent or enhancing abrasion resistance of the back coating layer. According to characteristics of the curing agent, heat, actinic ray and pressure can be used alone or in combination thereof as a means for curing. Alternatively, an adhesion layer may be provided on the back coat layer side of the support.

The backing coat layer preferably has a scratch resistance strength of at least 10 g (specifically, 10 to 500 g) and more preferably at least 20 g (specifically, 20 to 500 g), which is determined using a scratch tester provided with a 0.1 mmR needle. Scratch test is carried out in the following manner. Thus, a back coat layer is provided on a support and is allowed to stand for one day in an atmosphere at 23° C. and 50% RH. Then, measurement is conducted using a scratch tester (HEIDON-18, available from HEIDON Co.) using a sapphire needle of 0.1 mmR. In the measurement, the scratch test is carried out three times over a length of 10 cm under a given load. The load at which a scratch penetrates to the support is defined as a scratch resistance strength. As described above it is also preferable to allow a matting agent to be included in the back coat layer.

Next, there will be described an ink sheet used together with the image receiving layer. The ink sheet is a film having a light-to-heat conversion function and an ink (or colorant) transfer function, which comprises on one side of a support a light-to-heat conversion layer having a function of converting light to heat and an ink layer. Such both functions may be provided in a single layer. There may optionally be provided a cushion layer or peeling layer between the foregoing layers and the support, an interlayer between the light-to-heat conversion layer and the ink layer, or a back coat layer on the opposite side (backside) of the support.

As a support is usable any one having rigidity, superior dimensional stability and smoothness as well as sufficient heat resistance at the time of image formation. Exemplary examples thereof include various types of paper materials comprised of monolayer or multi-layers, such as paper, coated paper, synthetic paper (polypropylene, polystyrene or composite material thereof, which is laminated with paper); plastic resin films or sheets, such as vinyl chloride resin sheet, ABS resin sheet, poly(ethylene terephthalate) film, poly(butylene terephthalate) film, poly(ethylene naphthalate) film, polyacrylate film, polycarbonate film, poly(ether ketone) film, polysulfone film, poly(ether sulfone) film, poly(ether imide) film, polyimide film, polyethylene film, polypropylene film, polystyrene film, stretched nylon film and polyacetate film, films or sheets formed of various metals; films or sheets formed of various kinds of ceramics; metal plates such as aluminum, stainless steel, chromium and nickel; and resin-coated paper laminated or evaporated with a metal thin layer. The support may be subjected to various treatments to enhance dimensional stability or antistatic property. Examples of an antistatic agent include cationic surfactants, anionic surfactants, nonionic surfactants, polymer antistatic agents, fine conductive particles, and compounds described in "11290 Chemical Goods" on page 875 to 876, published by KAGAKU-KOGYO NIPPO-SHA. Furthermore, commonly known surface modification techniques are also applicable. The support may be subjected to surface modification treatment commonly known in the art. Examples of the surface modification treatment include a flame treatment, sulfuric acid treatment, corona discharge treatment, plasma treatment and glow discharge treatment. To allow respective layers described later to be satisfactorily coated on the support, an adhesion layer may be provided on the support.

In cases when laser light is irradiated from the ink sheet side to form an image, the support of the ink sheet is preferably transparent. The thickness of the ink sheet support is preferably thinner than that of the image receiving sheet, in terms of easiness in overlapping. Thus, the thickness is preferably 30 to 150 μm, and more preferably 50 to 100 μm.

The light-to-heat conversion layer is a layer having a function of converting light to heat. In cases where a light-to-heat conversion material is included in an ink layer, the light-to-heat conversion layer may not be specifically needed. In cases where the light-to-heat conversion material is not substantially transparent, it is desirable to provide a light-to-heat conversion layer separated from the ink layer, taking into account the color reproduction of transferred images. The light-to-heat conversion layer is provided preferably between the support and an ink layer, and more preferably between a cushion layer and the ink layer. As a binder used in the light-to-heat conversion layer is employed a resin exhibiting a relatively high glass transition temperature (Tg) and a relatively high thermal conductivity, including generally known heat-resistant resins such as polymethyl methacrylate, polycarbonate, polystyrene, ethyl cellulose, nitrocellulose, polyvinyl alcohol, polyvinyl chloride, polyamide, polyimide, polyether imide, polysulfone, polyether sulfone, and aramid; polythiophenes, polyanilines, polyacetylenes, polyphenylenes, polyphenylene-sulfides, polypyrrols, and their derivatives or polymeric compounds comprised of their mixture. Water-soluble polymers are also usable as a binder used in the light-to-heat conversion layer. The water-soluble polymers are preferable in terms of satisfactory peelability from the ink layer, superior heat-resistance at the time of laser irradiation and less scattering even when excessively heated. When using the water-soluble polymer, it is preferred to modify light-to-heat conversion material so as to be water-soluble (e.g., by introducing a sulfo group) or to disperse it in an aqueous medium. Allowing releasing agents to be included in the light-to-heat conversion layer promotes peeling of the ink layer from the light-to-heat conversion layer, thereby enhancing sensitivity. Useful releasing agents include, for example, silicone type releasing agents (e.g., polyoxyalkylene-modified silicone oil, alcohol-modified silicone oil), fluorinated surfactants (e.g., perfluorophosphoric acid ester type surfactant) and various types of surfactants. As light-to-heat conversion material, which is dependent on the kind of light sources is desirable material permitting efficient conversion of light to heat. In cases where a semiconductor laser is used as a light source, for example, material having absorption in the near-infrared region is desirable. Examples of preferred near-infrared absorbers include organic compounds such as carbon black, cyanine-type, polymethine-type, azulenium-type, squalilium-type, naphthoquinone-type, or anthraquinone-type dyes; organic metal complexes such as phthalocyanine-type, azo-type and thioamido-type. Exemplary compounds are described in JP-A No. 63-139191, 64-33547, 1-160683, 1-280750, 1-293342, 2-2074, 3-26593, 3-30991, 3-34891, 3-36093, 3-36094, 3-36095, 3-42281, 3-97589, and 3-103476. These compounds may be used alone or in combination. The thickness of the light-to-heat conversion layer is preferably 0.1 to 3 $\mu$m, and more preferably 0.2 to 1.0 $\mu$m. The light-to-heat conversion material content in the light-to-heat conversion layer is determined so that the absorbance at the wavelength of a light source is 0.3 to 3.0, and more preferably 0.7 to 2.5. In the case of a light-to-heat conversion layer including carbon black, a layer thickness of more than 1 $\mu$m tends to result in reduced sensitivity, instead of causing scorching due to overheating of the ink layer, in which an irradiating laser power or absorbance of the light-to-heat conversion layer are optimally selected.

Furthermore, evaporation film is also feasible as a light-to-heat conversion layer. Examples thereof include evaporation layer of carbon black or metal black of gold, silver, aluminum, chromium, nickel, antimony, tellurium, bismuth and selenium, as described in JP-A No. 52-20842; and evaporation layers of metal elements of groups Ib, IIb, IIIa, IVb, Va, Vb, VIa, VIb, VIIb and VIII of the periodic table and their alloys, alloys of these elements and elements of groups Ia, IIa and IIIb or mixtures thereof. Specifically, preferred metals include Al, Bi, Sn, In, Zn and their alloys; alloys of the foregoing metals and elements of group Ia, IIa or IIIb of the periodic table, or mixture thereof. Appropriate metal oxides and metal sulfides include compounds of Al, Bi, Sn, In, Zn, Ti, Cr, Mo, W, Co, Ir, Ni, Pb, Pt, Cu, Ag, Au, Zr, and Te, or mixtures thereof. There are also cited evaporation layers of metal phthalocyanines, metal dithiolene and anthraquinones. The thickness of the evaporation layer is preferably not more than 500 Å. Further, the light-to-heat conversion material may be a colorant itself in the ink layer, and in addition to the foregoing materials, various compounds are also usable as light-to-heat conversion material. In cases where the light-to-heat conversion layer is deteriorated in adhesion to the lower layer, when a transfer material is peeled off from the image receiving sheet at the time light exposure or after thermal transfer, delaminating often occurs, causing color contamination, so that an adhesive layer (or adhesion promoting layer) may be provided between the support and the lower layer.

The ink layer is mainly comprised of a colorant and a binder. In the laser melt thermal transfer method, the ink layer is a layer capable of melting or softening upon heating and also of transferring the overall layer containing a colorant and a binder. In this case, transfer may not be necessarily conducted in the completely melted state.

Examples of the colorant include inorganic pigments (e.g., titanium dioxide, carbon black, graphite, zinc oxide, Prussian blue, cadmium sulfide, iron oxide, and lead, zinc, barium and calcium chromates), organic pigments (e.g., azo-type, thioindigo-type, anthraquinone-type, anthraanthrone-type, anthoanthrone-type, and triphenedioxazine-type pigments, vat dye pigments, phthalocyanine pigments and their derivatives and quinacridone pigments) and dyes (acid dyes, direct dyes, disperse dyes, oil-soluble dyes, metal-containing oil-soluble dyes and sublimation dyes). In the case of a color proof material, for example, pigments C.I.21095 or C.I.21090, C.I.15850:1 and C.I.74160 are respectively used as preferable yellow, magenta and cyan pigments. The colorant content of the ink layer, which is adjusted to have an intended density at an intended layer thickness, is usually within the range of 5 to 70% by weight, and preferably 10 to 60% by weight.

Binders of the ink layer include thermally fusible material and thermoplastic resins. The thermally fusible material used in the invention is a solid or semi-solid material exhibiting a melting point of 40 to 150° C., which is measured using an apparatus, Yanagimoto MJP-2 Type. Examples thereof include vegetable waxes such as carnauba wax, Japan wax, auricurie wax, espar wax; animal waxws such as bees wax, insect wax, shellac wax and whale wax; petroleum waxes such as paraffin wax, microcrystal wax-polyethylene wax, ester wax and acid wax; and mineral waxes such as montan wax, ozocerite wax and ceresin. Further to the foregoing waxes are also cited higher fatty acids such as palmitic acid, stearic acid, margaric acid, and behenic acid; higher alcohols such as palmityl alcohol, stearyl alcohol, behenyl alcohol, marganyl alcohol, myricyl alcohol and eicosanol; higher fatty acid esters such as cetyl palmitate, myricyl palmitate, cetyl stearate, and myricyl stearate; amides such as acetoamide, propionic acid amide, palmitic acid amide, stearic acid amide, and amide wax; and higher amines such as stearylamine, behenylamine, and palmitylamine.

Examples of the thermoplastic resin include an ethylene type copolymer, polyamide type resin, polyester type resin, polyurethane type resin, polyolefin type resin, styrene type resin, styrene-acryl type resin, acryl type resin, vinyl chloride type resin, cellulose type resin, rosin type resin, polyvinyl alcohol type resin, polyvinylacetal type resin, ionomer resin, petroleum type resin, and resins used for binders of an ink layer, describe in JP-A No. 6-312583, and resins having a melting point or TMA softening point of 70 to 150° C. In addition to the foregoing thermoplastic resins, elastomers such as natural rubber, styrene-butadiene rubber, isoprene rubber, chloroprene rubber, and diene type copolymer; rosin derivatives such as ester gum, rosin maleic acid resin, rosin phenol resin and hydrogenated rosin; polymeric compounds such as phenol resin, terpene resin, cyclopentadiene resin, and aromatic hydrocarbon resin.

An appropriate selection of the foregoing thermally fusible materials and thermoplastic resins enables formation of a thermally transferable ink layer having the intended thermal softening point or thermal melting point.

In the invention, the use of binders exhibiting a high thermal decomposability, i.e., a pyrolytic binder enables formation of images through ablation transfer. As such binders is cited a polymeric material causing rapid acid-catalyzed partial decomposition when measured under equilibrium conditions, and preferably at a temperature of not more than 200° C. Examples thereof include nitrocelluloses, polycarbonates, and polymers, as described in J. M. J. Frechet, F. Bouchard. J. M. Houlihan, B. Kryczke, and E. Eichler, J. Imaging Science, 30 (2) 59–64 (1986); polyurethanes, polyesters, polyorthoesters, polyacetals and their copolymers. These polymers are detaied in the foregoing report by J. M. Houlihan et al., including their mechanisms.

JP-A No. 62-158092 discloses that making pigment particle sizes uniform (or narrowing the pigment particle size distribution) resulted in a higher density. It is effective to use various kinds of dispersing agents to maintain dispersion stability of a pigment and to achieve superior color reproduction. As other additives are feasible an addition of a plasticizer to enhance sensitivity by plasticization of the ink layer, addition of a surfactant to improve coatability of the ink layer, and addition of particles of a sub-micron to micron order (such as matting agents) to prevent blocking of the ink layer.

The thickness of the ink layer relating to the invention is preferably 0.2 to 2 $\mu$m, and more preferably 0.3 to 1.5 $\mu$m.

It was also found that an thickness of 0.8 μm or less resulted in higher sensitivity. However, thin-layer transferability of the ink layer depends on the kind of a binder or pigment used therein, or a mixing ratio thereof, so that an appropriate layer thickness range can be selected by balancing sensitivity and resolution, or based on desired image reproducibility.

An interlayer, which is provided between the light-to-heat conversion layer and the ink layer is comprised of a binder and optionally a cross-linking agent, sensitizer and surfactant. The interlayer is supposed to prevent a light-to-heat conversion dye contained in the light-to-heat conversion layer (an infrared absorbing dye in cases when an infrared laser is used as a light source) from diffusion at the time of coating or drying the interlayer or the ink layer or aging diffusion after manufacture of an ink sheet, thereby achieving high sensitivity of the ink sheet or minimizing aging variation in sensitivity. Further, incorporation of a sensitizer or a compound having a boiling point of 100 to 400° C. into the interlayer has achieved higher sensitivity. Preferred as a binder used in the interlayer, which depends on the constitution of the light-to-heat conversion layer is a resin, which is soluble in a solvent having a solubility of 0.1% or less for a light-to-heat conversion dye.

Next, the imaging process according to the invention will be described. In one example of the imaging process using the image receiving sheet according to the invention, the image receiving sheet and an ink sheet are wound in this order around an exposure drum and tightly maintained under evacuation, a laser beam is exposed from the back side of the ink sheet (or from the backing layer side) in accordance with image data and absorbed in the ink sheet to be converted to heat and the converted heat causes an image to be transferred from the recording material to the image receiving sheet.

Thus, the imaging process according to the invention comprises the steps of:

1) superposing an ink sheet on an image receiving sheet so as to be closely brought into contact with each other and subjecting them to imagewise laser exposure to transfer an image from the ink sheet to the image receiving sheet; and 2) repeating the foregoing step plural times to form a color image on the image receiving sheet, causing the formed color image to be faced to a final recording medium, applying heat and/or pressure thereto to cause the image receiving sheet to be adhered to the final recording medium, followed by peeling the image receiving sheet to cause the image, together with the image receiving layer, to be transferred onto the final recording medium.

As described above, the image receiving sheet of the invention is transferable. The image receiving sheet can be loaded onto large format proof, Color Decision type 1 and type 2 (products of Konica Corp.) and Final Proof (produced by Fuji Photo. Film Co., Ltd.), which are commercially available, and the use thereof is a preferable embodiment. When using such a large format proof, after laser recording, the steps for transfer onto a final receiving medium (or final recording medium) and for peeling are required. In cases where printing paper is used as a final recording medium, transferring onto a desired recording medium is feasible using a laminator, such as EV-Laminator or EV-Laminator II (which are available from Konica Corp.), or Match Print Laminator 447 (available from IMASION Co.). After completion of such transferring, recorded material extremely approximating printing material can be obtained by peeling the image receiving sheet.

The laminator is used preferably at a pressure of 2 to 98 N/cm, and more preferably 9.8 to 39.2 N/cm. It is difficult to achieve sufficient transfer at a pressure of less than 2 N/cm and transportability of thin paper tends to deteriorate at a pressure of more than 98 N/cm. The laminating temperature is preferably 80 to 150° C., and more preferably 90 to 130° C. Storage stability of the image receiving sheet tends to deteriorate at a temperature of lower than 80° C. and transportability tends to worsen at a temperature higher than 150° C. The lamination rate is preferably 2 to 50 mm/sec, and more preferably 3 to 30 mm/sec. The load on the motor becomes excessive at a rate of less than 2 mm/sec, adversely affecting transportability, and jamming of thin paper tends to occur at a rate of more than 50 mm/sec. The laminating roll diameter of the laminator is preferably 10 to 300 mm, and more preferably 30 to 150 mm. A diameter of less than 10 mm often deteriorates temperature uniformity at the time of transferring and a diameter of more than 300 mm increases heat capacity, so that a heating time increases. When a roll with a relatively large diameter is used, it is preferred to use a roll exhibiting relatively high thermal conductivity. The laminator used in the invention is required to have a relatively high thermal uniformity within the surface plane. A fluctuation of the thermal distribution in the longitudinal direction is preferably within ±5° C., and more preferably within ±3° C. To satisfy such a requirement, it is preferred that forced air-exhaust is not conducted in the laminating apparatus and any fresh air suction port is shielded as much as possible, and it is also preferred that lamination is conducted so that a shorter edge of the transferred body is arranged in the transporting direction.

Laser light sources for use in image recording of a laser exposure apparatus used in the invention include a semiconductor laser, YAG laser, carbon dioxide laser and helium-neon laser. Of semiconductor lasers, a so-called single-mode laser diode is preferably used, in which a $1/e^2$ diameter is easily narrowed to a level of some single digit μms to some tens of μms. Light sources other than laser include a light emitting diode (LED). As a useful array of integrating plural light-emitting elements are cited LED and semiconductor lasers. It is preferred to conduct, at first, image recording of a laser melting thermal transfer recording medium having a color, which is set so that absorption is greatest at the exposure wavelengths of the recording material. In the laser thermal transfer recording relating to the invention, imagewise exposure is conducted while a thermal transfer recording medium is brought into closecontact with a medium to be recorded (for example, under evacuation), in which excessively high absorption results in increased generation of gas (which occurs irrespective of presence/absence of ablation), often leading to deteriorated transfer. In cases when monochromatic images are repeatedly recorded to superpose plural colors, it is preferred to preferentially transfer a color generating a larger amount of gas, thereby enhancing closer contact and stabilizing sensitivity of the second or subsequent colors. Specifically, it is preferred to preferentially transfer a black color having an absorption in an infrared region.

Laser scanning methods include, for example, external cylindrical scanning, internal cylindrical scanning and plane scanning. In the external cylindrical scanning, laser exposure is performed with rotating a drum, around which a recording material is wounded and in which drum rotation and laser light movement are performed as a main-scan and a sub-scan, respectively. In the internal cylindrical scanning, a recording material is fixed on the internal side of the drum and a laser beam is irradiated from the inside, in which a part or all of an optical system is rotated in the circumferential direction to perform main-scanning, while part or all of the optical system is moved linearly parallel to the drum shaft to perform sub-scanning. In the plane scanning, the main-scanning is performed by combining a polygon mirror or galvanomirror with an fO lens, while the subscanning is performed by moving the recording medium. The external cylindrical scanning and the internal cylindrical scanning easily enhance precision of the optical system and are more suitable for high density recording. In the case of so-called multichannel exposure, in which plural emitting elements are concurrently used, the external cylindrical scanning is most suitable. In cases when YAG having a high exposure output is used, it is difficult in the external cylindrical scanning to achieve a marked increase of the rotation rate, so that the internal cylindrical scanning is more suitable.

EXAMPLES

The present invention will be further described based on examples but embodiments of the invention are not limited to these. Unless otherwise noted, "part(s)" represents part(s) by weight and "%" represents % by weight.

Comparative Example 1 (Comp.1)

Preparation of Image Receiving Sheet

Respective coating solutions of a heat-softening layer, an interlayer and an image receiving layer were successively coated on the support 1 and dried according to the following conditions to obtain an image receiving sheet:

Heat-softening layer: 15 g/$m^2$, 100° C., 5 min.;

Interlayer: 2.0 g/$m^2$, 80° C., 1 min.;

Image receiving layer: 1.5 g/$m^2$, 80° C., 1 min.

Support 1

V-PET film (Crisper G-1212 #100, available from TOYOBO CO., LTD)

| Heat-softening layer coating solution 1 | |
|---|---|
| Polyethylene latex (S3127, available from TOHO CHEMICAL INDUSTRY CO., LTD) | 100 parts |
| **Interlayer coating solution 1** | |
| Ethyl cellulose (ETHOCEL STANDARD-10 PREM, available from Dow Chemical Co.) | 13 parts |
| Industrial ethyl alcohol | 87 parts |
| **Image receiving layer coating solution 1** | |
| Acryl resin latex (YODOZOL A5801, available from Nippon NSC Co., resin content 5%) | 25 parts |
| Matting agent (MX-40S-2, available from Soken Kagaku Co., Ltd., 25% aq. solution) | 1.8 parts |
| Fluororesin (UNIDYNE TG810, available from DAIKIN INDUSTRIES LTD. resin content 15%) | 4.2 parts |
| i-Propyl alcohol | 6 parts |
| Water | 60 parts |

Imaging Process

Using the foregoing image receiving sheet, and the following transfer film, exposure system and laminator, an image was formed on the image receiving sheet and then transferred to a final recording medium.

Transfer film: Color Decision II Transfer Film (CDII-1M, available from Konica Corp.)

Exposure system: Color Decision II EV-laser Proofer II (available from Konica Corp.)

Laminator: Color Decision II EV-Laminator II (available from Konica Corp.)

Final recording medium: Three mediums were used as below;

Medium 1: TOKURYO ART (available from Mitsubishi Paper Mills Ltd.), 127.9 g/$m^2$;

Medium 2: NEW AGE (available from OJI PAPER CO., LTD), 127.9 g/$m^2$

Medium 3: NPI Joshitsu (available from Nippon Paper Industries Co., Ltd.), 127.9 g/$m^2$

Comparative Example 2 (Comp.2)

An image receiving sheet was prepared similarly to Comparative Example 1, except that the image receiving layer coating solution 1 was replaced by the following image receiving layer coating solution 2. The imaging process was conducted similarly to Comparative Example 1.

| Image receiving layer coating solution 2 | |
|---|---|
| Acryl resin latex (YODOZOL A5801, resin content 55%) | 25 parts |
| Fluororesin (UNIDYNE TG810, resin content 15%) | 5.0 parts |
| i-Propyl alcohol | 6 parts |
| Water | 60 parts |

Example 1 (Ex.1)

An image receiving sheet was prepared similarly to Comparative Example 2, except that the interlayer coating solution 1 was replaced by the following interlayer coating solution 2. The imaging process was conducted similarly to Comparative Example 2.

| Interlayer coating solution 2 | |
|---|---|
| Ethyl cellulose (ETHOCEL STANDARD-10 PREM) | 10.5 parts |
| Silicone particles (Tospearl T-130, available from Toshiba Silicone Co., Ltd.) | 2.5 parts |
| Industrial ethyl alcohol | 87 parts |

Example 2 (Ex. 2)

An image receiving sheet was prepared similarly to Example 1, except that the image receiving layer coating solution 2 was replaced by the following image receiving layer coating solution 3. The imaging process was conducted similarly to Example 1.

| Image receiving layer coating solution 3 | |
|---|---|
| Acryl resin latex (YODOZOL A5801, resin content 55%) | 10 parts |
| Styrene-acryl resin latex (YODOZOL GX-1, available from Nippon NSC Co., resin content 50%, MFT 90° C.) | 10 parts |
| Fluororesin (UNIDYNE TG991, available from DAIKIN INDUSTRIES LTD. resin content 18.5%) | 10 parts |
| i-Propyl alcohol | 6 parts |
| Water | 60 parts |

Example 3 (Ex.3)

An image receiving sheet was prepared similarly to Example 2, except that the interlayer coating solution 2 was replaced by the following interlayer coating solution 3 and the image receiving layer coating solution 3 was replaced by the following image receiving layer coating solution 4. The imaging process was conducted similarly to Example 2.

| Interlayer coating solution 3 | |
|---|---|
| Methyl cellulose (Metolose SM15, available from Shin-Etsu Chemical Ind. Co., Ltd.) | 10.5 parts |
| PMMA particles (MX-300, available from Soken Kagaku Co., Ltd., volume average primary particle size 3.05 μm, measured by the Coulter counter method, standard deviation 0.323 μm) | 2.5 parts |
| Surfactant (FTERGENT FT251, available from Neos Co.) | 0.13 part |
| i-Propyl alcohol | 17 parts |
| Deionized water | 70 parts |
| Image receiving layer coating solution 4 | |
| Acryl resin (DIANAL BR105, available from Mitsubishi Rayon Co., Ltd.) | 20 parts |
| Surfactant (F-178K, available from DAINIPPON INK & CHEMICALS INC.) | 0.05 part |
| Additive (Sumilizer GS, SUMITOMO CHEMICAL CO., LTD.) | 0.05 part |
| Methyl ethyl ketone | 40 parts |
| Cyclopentanone | 40 parts |

Example 4

An image receiving sheet was prepared similarly to Example 3, except that the image receiving layer coating solution 4 was replaced by the following image receiving layer coating solution 5. The imaging process was conducted similarly to Example 3.

| Image receiving layer coating solution 5 | |
|---|---|
| Acryl resin (DIANAL BR105) | 20 parts |
| Silicone particles (Tospearl T-130) | 0.1 part |
| Surfactant (F-178K) | 0.05 part |
| Additive (Sumilizer GS) | 0.05 part |
| Methyl ethyl ketone | 40 parts |
| Cyclopentanone | 40 parts |

Example 5

An image receiving sheet was prepared similarly to Example 4, except that the interlayer coating solution 3 was replaced by the following interlayer coating solution 4. The imaging process was conducted similarly to Example 4.

| Interlayer coating solution 4 | |
|---|---|
| Methyl cellulose (Metolose SM15) | 9.75 parts |
| PMMA particles (MX-300, volume average primary particle size 3.05 μm, measured by the Coulter counter method, standard deviation 0.323 μm) | 2.6 parts |
| Additive (UNIDYNE TG991, available from DAIKIN INDUSTRIES LTD. 18.5% solids) | 3.5 parts |
| Surfactant (FTERGENT FT251) | 0.13 part |
| i-Propyl alcohol | 17 parts |
| Deionized water | 70 parts |

Comparative Examples 1 and 2, and Examples 1 through 5 were evaluated according to the following manner, based on the criteria described below.

Surface Roughness

Samples were measured in the form having the following layer arrangement, using RST/PLUS (produced by WYCO Co.), in which surface roughness Ra and Rz were represented in μm.

Support/Heat-softening layer

Support/Heat-softening layer/Interlayer

Support/Heat-softening layer/Interlayer/Image receiving layer

Sensitivity

Using the system used in the foregoing imaging process, after focusing, exposure was made with varying the writing speed in an atmosphere at 23° C. and 50% RH and images were retransferred to the final recording medium (TOKURYO ART) and observed with a magnifier. Sensitivity was represented by an exposure rotation rate (rpm) giving a uniform solid image. The greater the exposure rotation rate, the higher the sensitivity, indicating that writing is feasible at a higher speed.

Glossiness

The difference in glossiness between paper and an imaging area or non-imaging area was measured with respect to images retransferred to the final recording medium (TOKURYO ART paper). The glossiness is a value measured at 60-60° (glossiness at an angle of 60°), in accordance with the method defined in JIS. Glossiness of the TOKURYO ART paper was 37. Evaluation was based on the following criteria:

A: the difference was less than 10% with respect to imaging and non-imaging areas, B: the difference was 10 to 20% with respect to imaging and non-imaging areas, C: the difference was more than 20% with respect to at least one of imaging and non-imaging areas.

Solid Image Quality

After exposure was made at an appropriate sensitivity, solid images which were retransferred onto the final recording medium (TOKURYO ART paper) were observed visually or with a magnifier and evaluated based on the following criteria:

A: no unevenness in exposure pitch was observed even by using a magnifier,

B: no unevenness was visually observed but unevenness was observed by using a magnifier, C: unevenness in exposure pitch was apparent to the naked eye.

Fine-line and Overall Uniformity

Using magenta ink in an exposure apparatus outputting B2 size and also using images repeating single dot line & spaced image/solid image in the main-scanning direction, exposure was made at an appropriate sensitivity, then, images which were retransferred onto TOKURYO ART paper were observed visually or with a magnifier and evaluated based on the following criteria:

A: the single dot line was reproduced uniformly and clearly,

B: reproducibility was slightly unstable and a missing portion was partially observed in the single dot line, C: reproducibility was unstable and missing portions were overall observed in the single dot line, and reduced densities were partially observed in the solid image.

Peeling

Using magenta ink in an exposure apparatus outputting B2 size, an overall magenta solid image was outputted at an appropriate sensitivity and retransferred onto the TOKURYO ART paper, and after peeling, images were visually observed and evaluated based on the following criteria:

A: images were overall uniformly transferred,

AB: non-uniformity in peeling was observed in the edge portions,

B: overall non-uniformity in peeling was observed,

C: peeling was not achieved.

Transfer-fixing Ability

Using a magenta ink in an exposure apparatus outputting B2 size, an overall magenta solid image was outputted at an appropriate sensitivity and retransferred onto the TOKURYO ART paper. "Cover-up Tape 652" (available SUMITOMO 3M Co., Ltd.) was adhered to the imaging/non-imaging areas and then peeled therefrom. The imaging/non-imaging areas were visually observed with respect to peel-off and evaluated based on the following criteria:

A: no peeling-off occurred in the imaging/non-imaging areas,

B: partial peeling-off occurred in the imaging/non-imaging areas,

C: pronounced peeling-off occurred in the imaging/non-imaging areas.

Blocking side was peeled on a flat bench and the image receiving layer was visually observed with respect to peeling-off and evaluated based on the following criteria:

A: no peeling-off occurred,

B: overall peeling-off occurred.

Environment Dependence

Exposure was made under the exposure condition suited at 23° C. and 50% RH in different exposure environments. Thus, exposure was conducted under the following five environments:

18° C. and 20% RH, 18° C. and 80% RH, 23° C. and 50% RH,

28° C. and 20% RH, and 28° C. and 80% RH, and the 50% dot gain was measured for the respective environments. The maximum dot gain in the different environments was determined and evaluated based on the following criteria:

A: the difference from the maximum dot gain was not more than 2,

B: the difference from the maximum dot gain was not more than 3.5,

C: the difference from the maximum dot gain was not more then 5.

Results are shown in Table 1.

TABLE 1

| Image Receiving | Heat-softening Layer | | Interlayer | | Image Receiving Layer | | Sensitivity | Glossi- | Solid Image Qual- | Fine-line Uniform- | Peel- | Fix- | Block- | Environment Depen- |
|---|---|---|---|---|---|---|---|---|---|---|---|---|---|---|
| Sheet | $R_a$ | $R_z$ | $R_a$ | $R_z$ | $R_a$ | $R_z$ | (rpm) | ness | ity | ity | ing | ability | ing | dence |
| Comp. 1 | 0.02 | 0.5 | 0.02 | 0.3 | 0.24 | 5.5 | 540 | A | B | A | A | A | A | C |
| Comp. 2 | 0.02 | 0.5 | 0.02 | 0.3 | 0.02 | 0.8 | 600 | C | A | C | A | A | C | C |
| Ex. 1 | 0.02 | 0.5 | 0.1 | 1.2 | 0.02 | 0.8 | 600 | A | A | C | AB | A | C | C |
| Ex. 2 | 0.02 | 0.5 | 0.1 | 1.2 | 0.02 | 0.8 | 600 | A | A | C | AB | A | A | C |
| Ex. 3 | 0.02 | 0.5 | 0.1 | 1.2 | 0.02 | 0.8 | 600 | A | A | C | AB | A | A | A |
| Ex. 4 | 0.02 | 0.5 | 0.1 | 1.2 | 0.05 | 1.0 | 600 | A | A | A | AB | A | A | A |
| Ex. 5 | 0.02 | 0.5 | 0.1 | 1.2 | 0.05 | 1.0 | 600 | A | A | A | A | A | A | A |

Each of the image receiving sheets was coated, on the opposite side of the support to the image receiving layer, with the following backing layer coating solution in a coverage of 2.5 g/$m^2$ to form a backing layer. Thereafter, drying was carried out at 100° C. for 1 min.

| Backing layer coating solution | |
|---|---|
| Polyester resin (VYLON 200, available from TOYOBO CO., LTD.) | 9.0 parts |
| Matting agent (MX1000, available Soken Kagaku Co., Ltd.) | 0.3 part |
| Carbon black (MHI-273, available from Mikuni Shikiso Co., Ltd., 18% MEK dispersion) | 3.6 parts |
| Cyclohexanone | 40 parts |
| Toluene | 20 parts |
| Methyl ethyl ketone | 27.1 parts |

The thus back-coated image receiving sheets were superposed so as to bring the image receiving layer side into contact with the backing layer side and allowing them to stand in an atmosphere at 55° C. for 3 days, while being subjected to a load of 50 g/$m^2$. Thereafter, the backing layer As is apparent from the results, comparing to the prior art, enhancements of a recording speed and solid image quality could be achieved according to the invention, while satisfying glossiness of imaging area and non-imaging area, which closely resemble printing actual paper. In one preferred embodiment of the invention, while maintaining a softening point of the whole image receiving layer, stickiness at ordinary temperature was lowered so that an improvement in blocking was achieved by adding a binder having a relatively high Tg or by adding a large amount of a releasing agent. It was proved that the use of a water-insoluble binder in the image receiving layer as the uppermost layer led to reduced variation in exposure characteristics for environmental temperature and humidity. It was confirmed that incorporation of a matting agent into the image receiving layer to an extent of not varying surface roughness of the image receiving layer resulted in enhancements in fine-line reproduction and overall surface uniformity. It was further confirmed that incorporation of a releasing agent into the interlayer led to improvements in effective peeling caused by increased peeling surface area due to the roughened interlayer.

Example 6

Using coating solutions used in Example 5, 16 kinds of image receiving sheets were prepared, provided that the heat-softening layer, interlayer and image receiving layer were successively coated on the support 1 under the condition described below and the thickness of the interlayer or image receiving layer was varied as shown in Table 2, in which the thickness was represented in terms of coverage, as shown below. The imaging process was conducted similarly to Example 3.

Heat-softening layer: 15 g/m$^2$; 100° C. and 5 min;

Interlayer: 0.5, 1.0, 2.5 or 5.0 g/m$^2$; 80° C. and 3 min.;

Image receiving layer: 0.5, 1.0, 2.5 or 5.0 g/m$^2$; 80° C. and 3 min.

Results are shown in Table 2.

TABLE 2

| Image Receiving Sheet | Coverage (g/m$^2$) Inter-layer | Image Receiving Layer | Surface Roughness (μm) Interlayer $R_a$ | $R_z$ | Image Receiving Layer $R_a$ | $R_z$ | Sensi-tivity (rpm) | Art Gloss | | Solid Image Quality | Peeling | Fix-ability |
|---|---|---|---|---|---|---|---|---|---|---|---|---|
| Ex. 6 | 0.5 | 0.5 | 0.3 | 3.6 | 0.18 | 4.4 | 550 | 22 | C | B | A | A |
| | 0.5 | 1.0 | 0.3 | 3.6 | 0.1 | 3.2 | 580 | 30 | B | A | A | A |
| | 0.5 | 2.5 | 0.3 | 3.6 | 0.08 | 1.9 | 590 | 36 | A | A | A | A |
| | 0.5 | 5.0 | 0.3 | 3.6 | 0.02 | 1.2 | 600 | 45 | B | A | A | A |
| | 1.0 | 0.5 | 0.18 | 2.4 | 0.13 | 3.4 | 580 | 28 | B | B | A | A |
| | 1.0 | 1.0 | 0.18 | 2.4 | 0.07 | 2.6 | 590 | 35 | A | A | A | A |
| | 1.0 | 2.5 | 0.18 | 2.4 | 0.03 | 1.6 | 600 | 41 | B | A | A | A |
| | 1.0 | 5.0 | 0.18 | 2.4 | 0.02 | 0.9 | 600 | 54 | C | A | A | A |
| | 2.5 | 0.5 | 0.09 | 1.3 | 0.07 | 2.5 | 590 | 35 | A | A | A | A |
| | 2.5 | 1.0 | 0.09 | 1.3 | 0.03 | 1.7 | 600 | 43 | B | A | A | A |
| | 2.5 | 2.5 | 0.09 | 1.3 | 0.02 | 1.2 | 600 | 51 | C | A | A | A |
| | 2.5 | 5.0 | 0.09 | 1.3 | 0.02 | 0.9 | 600 | 61 | C | A | A | A |
| | 5.0 | 0.5 | 0.05 | 0.7 | 0.02 | 1.1 | 600 | 63 | C | A | A | A |
| | 5.0 | 1.0 | 0.05 | 0.7 | 0.02 | 1.0 | 600 | 65 | C | A | A | A |
| | 5.0 | 2.5 | 0.05 | 0.7 | 0.02 | 0.9 | 600 | 71 | C | A | A | A |
| | 5.0 | 5.0 | 0.05 | 0.7 | 0.02 | 0.9 | 600 | 72 | C | A | A | A |
| Comp. 1 | 3.5 | 1.35 | 0.02 | 0.5 | 0.24 | 5.5 | 540 | 32 | A | C | A | A |

As can be seen from Table 2, it was proved that the use of image receiving sheets of the invention, in which the interlayer was added with a matting agent to roughen the surface thereof resulted in final images exhibiting superior solid image quality and enhanced sensitivity. Glossiness of the final recording medium can be approximated to the printing actual paper by the combination of optimum coverage amounts. Thus, it was proved that when using coating solutions of this Example, the following coverage combination of the interlayer and image receiving layer was preferred in terms of sensitivity and glossiness.

| Interlayer | Image receiving layer |
|---|---|
| 0.5 g/m$^2$ | 2.5 g/m$^2$ |
| 1.0 g/m$^2$ | 1.0 g/m$^2$ |
| 2.5 g/m$^2$ | 0.5 g/m$^2$ |

In the foregoing, the interlayer was added with PMMA particles having an average primary particle size of 3 μm, in an amount of 19% based on the total solid content. The optimum combination of coverage amounts is also adjustable, which is variable according to an amount, material, particle size, particle size distribution of a matting agent, material used in the image receiving layer and the presence/absence of a matting agent in the image receiving layer.

Example 7

On support 2, coating solutions of a heat-softening layer, an interlayer and an image receiving layer were successively coated by a wire-bar and dried to obtain image receiving sheets, provided that coating and drying were conducted according to the following conditions:

Heat-softening layer: 15 g/m$^2$; 100° C. and 5 min;

Interlayer: 1.0 g/m$^2$; 80° C. and 1 min.;

Image receiving layer: 1.5 g/m$^2$; 80° C. and 1 min.

Support 2

W-PET film (U51L74, #100, available from Teijin du Pont Polyester Co., Ltd.)

Coating solutions of the heat-softening layer and image receiving layer were the same as used in Example 4 and the following interlayer coating solution 5 was used.

| Interlayer coating solution 5 | |
|---|---|
| Hydroxypropylmethyl cellulose (Metolose 60SH15, available from Shin-Etsu Chemical Ind. Co., Ltd.) | 9.1 parts |
| Matting agent (as shown Table 3) | 3.9 parts |
| Additive (UNIDYNE TG810, available from DAIKIN INDUSTRIES LTD. effective component 15%) | 5.0 parts |
| i-Propyl alcohol | 17 parts |
| Deionized Water | 70 parts |

Results are shown in Table 3.

TABLE 3

| Image Receiving Sheet | Matting Agent Kind | Av. Size ($\mu$m) | Structure | Sp. G. | Dispersion | Surface Roughness ($\mu$m) Intermediate Layer $R_a$ | Intermediate Layer $R_z$ | Image receiving Layer $R_a$ | Image receiving Layer $R_z$ | Sensitivity (rpm) | Art Gloss | | Solid Image Quality | Peeling | *13 | *14 |
|---|---|---|---|---|---|---|---|---|---|---|---|---|---|---|---|---|
| Ex. 7 | *1*a | 0.1–0.2 | *11 | 1.2 | Poor | 0.02 | 0.5 | 0.06 | 1.1 | 600 | 75 | C | A | A | A | A |
| | *2*b | 0.6–0.9 | *11 | 1.2 | Poor | 0.03 | 0.95 | 0.06 | 1.1 | 600 | 47 | B | A | A | A | A |
| | *3*b | 1.8 | *11 | 1.2 | Good | 0.07 | 1.3 | 0.06 | 1.1 | 600 | 40 | A | A | A | A | AB |
| | *4*b | 1.8 | *11*c | 1.2 | Good | 0.09 | 1.2 | 0.06 | 1.1 | 600 | 38 | A | A | A | A | A |
| | *5*b | 5 | *11 | 1.2 | Good | 0.3 | 8.9 | 0.28 | 9.3 | 520 | 24 | C | C | B | B | B |
| | *6*b | 10 | *11 | 1.2 | Good | 0.55 | 13.4 | 0.58 | 15.6 | — | *12 | C | C | C | C | C |
| | *7 | 1.5 | $SiO_2$ | 2 | 1.4 | 0.07 | 1.2 | 0.06 | 1.1 | 600 | 37 | A | A | A | A | C |
| | *8 | 1.7 | PS | 1.05 | 0.05 | 0.08 | 1.2 | 0.06 | 1.1 | 600 | 42 | A | A | A | A | A |
| | *9 | 5.2 | PS | 1.05 | 0.12 | 0.31 | 7.5 | 0.25 | 7 | 540 | 26 | C | C | B | B | A |
| | *10 | 10.4 | PS | 1.05 | 0.16 | 0.57 | 12.3 | 0.54 | 12.9 | — | *12 | C | C | C | C | A |
| Comp. 1 | No matting agent in intermediate layer | | | | | 0.02 | 0.5 | 0.24 | 5.5 | 540 | 32 | A | C | A | A | — |

*1: MP-1451 (0.1–0.2 $\mu$m* SOKENKAGAKU Ltd)
*2: MP-1600 (0.6–0.9 $\mu$m* SOKENKAGAKU Ltd)
*3: MX-180 (1.8 $\mu$m*, SOKENKAGAKU Ltd)
*4: MX-180TA (1.8 $\mu$m*, SOKENKAGAKU Ltd)
*5: MX-500 (5 $\mu$m*, SOKENKAGAKU Ltd)
*6: MX-1000 (10 $\mu$m*, SOKENKAGAKU Ltd)
*7: E150 (1.5 $\mu$m*, NIPPON SHOKUBAI CO., LTD.)
*8: STADEX SC-171-S (1.7 $\mu$m*, JSR)
*9: DYNOSPHERES SS-052-P (5.2 $\mu$m*, JSR)
*10: DYNOSPHERES SS-101-P (10.4 $\mu$m*, JSR)
*11: PMMA (polymethyl methacrylate)
*12: Poor peeling
*13: Fixability
*14: Intermediate layer solution stability
*a: non-cured
*b: cured
*c: COCH-containing
PS: polystyrene
*: average particle size As can be seen from the results, it was proved that the average particle size of a matting agent preferably is not less than 0.6 $\mu$m and less than 5 $\mu$m.

However, as described earlier, the optimum point is variable with a relationship between particle size and coverage of a matting agent. Thus, in cases when a matting agent having a relatively small average particle size is used, the less interlayer thickness is preferred. The use of a relatively large particles needs to make the interlayer thicker. In fact, it was proved that to adjust glossiness to an optimum level using MP-1451, the interlayer thickness (expressed in coverage) was needed to be made not more than 0.03 g/m$^2$. In this case, it was difficult to control the coverage in the manufacturing process and when transferred to fine-quality paper, peeling became heavy. In view thereof, the use of MP-1451 was proved to be unsuitable for responsibility to broad kinds of paper. It was further proved that the use of MX-1000 required an interlayer thickness of 7.5 g/m$^2$ to adjust glossiness to a required level and improve solid image quality. When transferred to matt paper, sufficient transferability was not achieved and the use of MX-1000 was not suitable in terms of responsibility to broad kinds pf paper.

It was confirmed that smaller matting agent particles was preferred in terms of standing stability of a coating solution, which did not affect glossiness, sensitivity, solid image quality, fine-line reproduction and storage stability but was an important point in the manufacturing process. It was also confirmed that a matting agent having a relatively small specific gravity and containing a group exhibiting high miscibility to a dispersing medium (e.g., carboxyl group) was preferred.

Example 8

In this Example, there will be described means for achieving the object of the invention other than matting agents.

Incompatible Type

On the support 2 used in Example 7, coating solutions of the heat-softening layer and image receiving layer of Example 4 and interlayer coating solution 6, described below were coated by the wire-bar coating method and dried according to the following conditions.

Heat-softening layer: 15 g/m$^2$; 100° C. and 5 min;

Interlayer: 1.0 g/m$^2$; 80° C. and 1 min.;

Image receiving layer: 1.5 g/m$^2$; 80° C. and 1 min.

| Interlayer coating solution 6 | |
|---|---|
| Hydroxypropylmethyl cellulose (Metolose SEB4000, availablefrom Shin-Etsu Chemical Ind. Co., Ltd.) | 10 parts |

-continued

| Interlayer coating solution 6 | |
|---|---|
| Acrylate copolymer (Jurymer SEK-101, available from Nippon Junyaku Co., Ltd.) | 10 parts |
| i-Propyl alcohol | 30 parts |
| Deionized water | 70 parts |

The thus formed interlayer exhibited $R_a$ of 0.16 $\mu$m and $R_z$ of 2.1 $\mu$m. In the above composition, although a single component layer was highly transparent, a mixture layer was apparently turbid so that both resins were confirmed to be incompatible with each other. Problems were also found that the interlayer was weak in strength and vulnerable.

When an image receiving layer was coated on this interlayer, the image receiving layer exhibited $R_a$ of 0.06 $\mu$m and $R_z$ of 2.1 $\mu$m Embossing Type On the support 2 used in Example 7, coating solutions of the heat-softening layer and image receiving layer of Example 4 and interlayer coating solution 7, described below were coated by the wire-bar coating method and dried.

| Interlayer coating solution 7 | |
|---|---|
| Polyethylene latex (S7024, available from Toho Kagaku Co., Lt.) | 100 parts |
| i-Propyl alcohol | 30 parts |
| Deionized water | 70 parts |

The thus formed interlayer exhibited $R_a$ of 0.02 $\mu$m and $R_z$ of 0.5 $\mu$m. The interlayer was caused to pass through an embossing roller heated at 100° C. at a speed of 10 mm/sec with applying a line-pressure of 9.4 N/cm. The embossed interlayer exhibited $R_a$ of 0.15 $\mu$m and $R_z$ of 2.2 $\mu$m. When the image receiving layer was coated thereon, the formed image receiving layer exhibited $R_a$ of 0.05 $\mu$m and $R_z$ of 1.6 $\mu$m.

Using the thus prepared image receiving sheet, the imaging process and retransfer were conducted. As a result, superior results were obtained similarly to the use of a matting agent.

Example 9

In Example 9 and 10, cohesive failure type glossiness adjustment will be described.

Using the following heat-softening layer coating solution 2 and image receiving layer coating solution 6, wire-bar coating was conducted on the support 2 and dried according to the conditions described below to obtain an image receiving sheet.

Heat-softening layer: 15 g/m$^2$; 100° C. and 5 min;

Image receiving layer: 3.5 g/m$^2$; 80° C. and 3 min.

| Heat-softening layer coating solution 2 | |
|---|---|
| Ethylene-vinyl acetate copolymer (EV-40Y, available from Mitsui Du Pont Co., Ltd.) | 10 parts |
| Toluene | 20 parts |
| Methyl ethyl ketone | 40 parts |
| Cyclohexanone | 40 parts |

-continued

| Image receiving layer coating solution 6 | |
|---|---|
| Acryl resin (DIANAL BR105) | 10 parts |
| Carnauba wax | 10 parts |
| Methyl ethyl ketone | 40 parts |
| cyclohexanone | 40 parts |

Example 10

Using the heat-softening layer coating solution 2, interlayer coating solution 7 and image receiving layer coating solution 4, wire-bar coating was conducted on the support 2 and dried according to the following conditions to obtain an image receiving sheet.

Heat-softening layer: 15 g/m$^2$; 100° C. and 5 min;

Interlayer: 3.5 g/m$^2$; 130° C. and 3 min.;

Image receiving layer: 1.5 g/m$^2$; 130° C. and 1 min.

It was proved that these image receiving sheets obtained in Examples 9 and 10 exhibited a surface roughness of $R_a$=0.1 $\mu$m and $R_z$=1.1 $\mu$m as a result of the observation of the image receiving layer surface, and exposure sensitivity, solid image quality and other performances were substantially the same as in Example 3. Images were formed on these image receiving sheets, which were retransferred onto TOKURYO ART paper, followed by peeling. It was confirmed that from coverage amounts of the transferred layer, the relationship described in item 12. or 13 was met and image receiving layer/interlayer caused cohesive failure. From the glossiness measurement, it was further confirmed that the thus obtained image was closely resemble the final recording medium with respect to glossiness.

What is claimed is:

1. A transferable image receiving sheet comprising a support having thereon a heat-softening layer, an interlayer and an image receiving layer, wherein the interlayer has a surface roughness ($R_a$) of 0.05 to 5 $\mu$m and the image receiving layer has a surface roughness ($R_a$) of 0.01 to 0.4 $\mu$m, and the surface roughness ($R_a$) of the interlayer being greater than that of the image receiving layer.

2. The image receiving sheet of claim 1, wherein the heat-softening layer has a surface roughness ($R_a$) of 0.01 to 5.0 $\mu$m, and the surface roughness ($R_a$) of the interlayer being greater than that of the heat-softening layer.

3. The image receiving sheet of claim 1, wherein the interlayer contains a matting agent having an average primary particle size of 0.3 to 5 $\mu$m.

4. The image receiving sheet of claim 3, wherein the average primary particle size is 30 to 300%, based on a thickness of the interlayer.

5. The image receiving sheet of claim 3, wherein the average primary particle size is 20 to 200%, based on a total thickness of the interlayer and the image receiving layer.

6. The image receiving sheet of claim 3, wherein the matting agent has a specific gravity of 0.1 to 1.5.

7. The image receiving sheet of claim 1, wherein the interlayer has a thickness of 0.1 to 5.0 $\mu$m.

8. The image receiving sheet of claim 7, wherein the interlayer exhibits a surface roughness ($R_z$) of 0.3 to 10.0 $\mu$m.

9. The image receiving sheet of claim 1, wherein the image receiving layer has a thickness of 0.1 to 5.0 $\mu$m.

10. The image receiving sheet of claim 9, wherein the image receiving layer exhibits a surface roughness ($R_z$) of 0.3 to 5.0 $\mu$m.

11. The image receiving sheet of claim 1, wherein the image receiving layer contains a resin exhibiting a softening point of not less than 40° C.

12. An imaging process by use of an image receiving sheet comprising a support having thereon a heat-softening layer, an interlayer and an image receiving layer, the process comprising the steps of:

(a) superposing an ink sheet on the image receiving sheet and imagewise exposing the ink sheet to light to transfer an image from the ink sheet onto the image receiving sheet, (b) bringing the image receiving sheet into contact with a final recording medium to transfer the image onto the final recording medium, wherein the interlayer has a surface roughness ($R_a$) of 0.05 to 5.0 $\mu$m and the image receiving layer has a surface roughness ($R_a$) of 0.01 to 0.4 $\mu$m, and the surface roughness ($R_a$) of the interlayer being greater than that of the image receiving layer.

13. The imaging process of claim 12, wherein the ink sheet comprises a support having thereon an ink layer, said ink layer exhibiting a surface roughness ($R_a$) of 0.01 to 0.3 $\mu$m.

14. The imaging process of claim 13, wherein the ink layer exhibits a surface friction coefficient of not more than 0.35.

15. The imaging process of claim 13, wherein the ink sheet further comprises a light-to-heat conversion layer.

* * * * *